Figure 1:
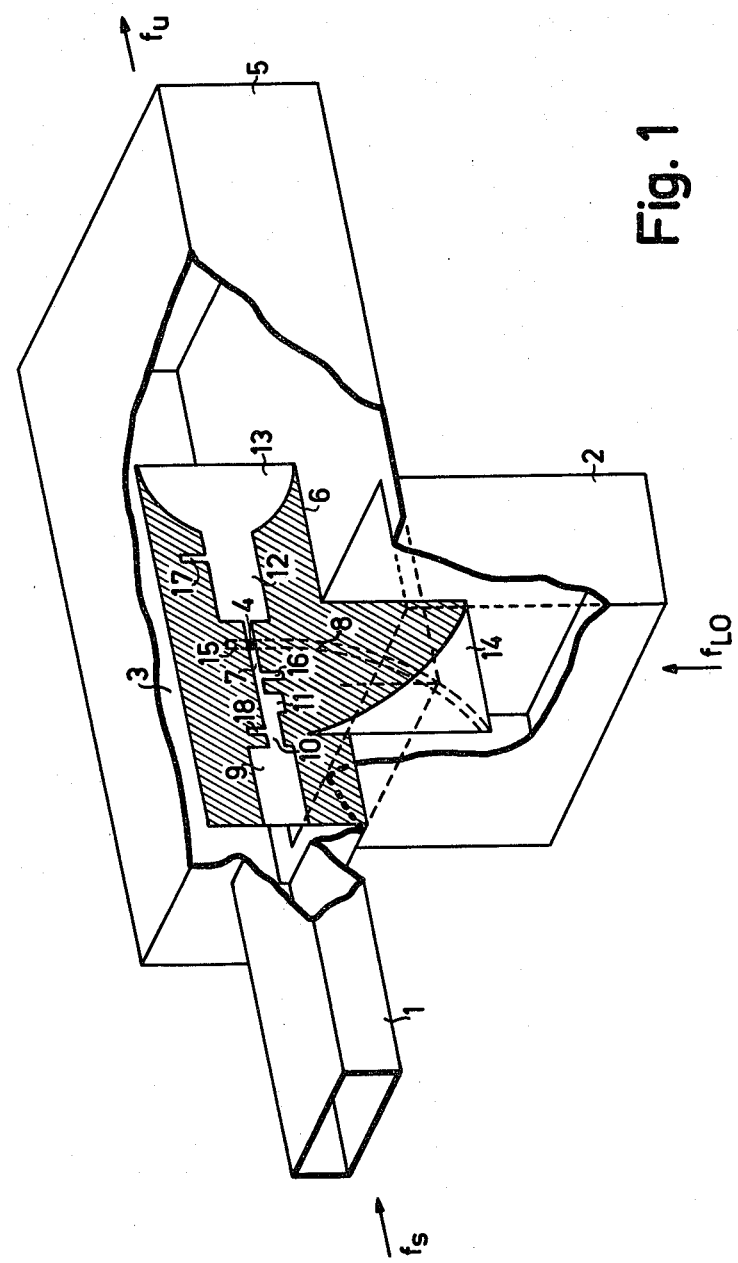

United States Patent [19]

Hoogstraate

[11] 4,188,584

[45] Feb. 12, 1980

[54] MIXER

[75] Inventor: Hendrik Hoogstraate, Delden, Netherlands

[73] Assignee: N. V. Hollandse Signaalapparaten, Hengelo, Netherlands

[21] Appl. No.: 898,472

[22] Filed: Apr. 20, 1978

[30] Foreign Application Priority Data

Apr. 28, 1977 [NL] Netherlands .................. 7704644

[51] Int. Cl.$^2$ ............................................. H04B 1/26
[52] U.S. Cl. .................................... 325/446; 325/445; 325/449; 363/159
[58] Field of Search .............. 325/442, 445, 446, 449, 325/451; 363/159; 330/4.9; 333/84 M

[56] References Cited

U.S. PATENT DOCUMENTS

| | | | |
|---|---|---|---|
| 3,678,395 | 7/1972 | Hunton et al. ....................... | 325/446 |
| 3,742,335 | 6/1973 | Konishi ................................ | 325/446 |
| 3,939,430 | 2/1976 | Dickens et al. ..................... | 325/446 |
| 4,000,469 | 12/1976 | McMaster .......................... | 325/445 |
| 4,118,670 | 10/1978 | Dickens ............................. | 325/446 |

Primary Examiner—Marc E. Bookbinder
Attorney, Agent, or Firm—Algy Tamoshunas

[57] ABSTRACT

A mixer is provided with a first waveguide part for the transmission of an input signal to be converted to a lower frequency band and with a second waveguide part for the transmission of a signal supplied by a local oscillator. The first and second waveguide parts open into a cavity containing a semiconductor which, disposed of its encapsulation, is mounted on a substrate and is used to obtain an output signal. The frequencies ($f_u$) of the output signal form a linear combination of the frequencies ($f_s$) of the input signal and the local oscillator frequency ($f_{LO}$). The substrate comprises at least two microwave integrated circuits, forming a connection between the semiconductor and the two waveguide parts, while the mixer further comprises a transmission line for the output signal.

6 Claims, 5 Drawing Figures

MIXER

The invention relates to a mixer provided with a first waveguide part for transmission of an input signal to be converted to a lower frequency band and with a second waveguide part for transmission of a signal supplied by a local oscillator. The first and second waveguide parts open into a cavity containing a first semiconductor, by means of which an output signal is obtained, the frequencies ($f_u$) of the output signal forming a linear combination of the frequencies ($f_s$) of the input signal and the local oscillator frequency ($f_{LO}$). The mixer is further provided with a transmission line for the output signal.

Such a mixer, using a semiconductor diode to obtain an output signal of frequencies $f_u = |f_s - f_{LO}|$ and a coaxial cable connected to the diode for the transmission of the output signal, is widely known as a "single ended mixer", which formerly found its application in radar receivers. The frequencies of the input signal and of the local oscillator had to be of the same order of magnitude, implying that 100 kHz $< f_u <$ 100 MHz. This resulted in a very acceptable noise figure of the detector-receiver, in which the mixer was incorporated; expressed in dB, this noise figure is the loss in the signal-to-noise ratio. To ensure that these results would not degenerate, in view of the local oscillator noise incurred, "balanced mixers" were employed in practice.

In the last years however semiconductors, notably GaAs field effect transistors, have been developed, limiting the noise figure of the intermediate frequency amplifiers to 2.5 dB at 1000 MHz and to 3-4 dB at 100 GHz. These results are such that the use of mixers converting input signals of a high frequency to signals of a frequency in the order of some gigahertz, still offer advantages. One of these advantages concerns the fact that in practice, notably in telecommunication, r.f. amplifiers employ an effective frequency band whose width is about 20% of the carrier wave frequency of the input signal to which these amplifiers are tuned; from an absolute point of view, the higher this frequency the wider the frequency band. Another advantage connected with relatively high values of $f_u = |f_s - f_{LO}|$ is that image frequencies $f_{sp} = |2f_{LO} - f_s|$ generated in the mixer can be suppressed. In spite of all these advantages, there remains the considerable drawback that the above-mentioned mixers show a very large noise figure. For example, in the conversion from 35 GHz to 60 MHz a commonly used balanced mixer rendered a noise figure of about 11 dB. It is therefore an object of the present invention to provide a mixer, in which the noise figure, thus the loss in signal-to-noise ratio expressed in dB, is considerably curtailed, notably in the cases requiring a conversion to frequencies in the order of some gigahertz.

According to the invention, the mixer set forth in the opening paragraph is designed so that the unencapsulated semiconductor is mounted on a substrate placed in the cavity referred to above. The substrate is provided with at least two microwave integrated circuits (MIC's), forming a connection between the semiconductor and the two waveguide parts.

The dimensions of encapsulated diodes, as used in the common "single ended" or "balanced" mixers, are in the order of those of the common waveguides, avoiding undesired parasitic capacitances; the omission of such an encapsulation limits the loss in signal-to-noise ratio by as much as 2-3 dB. The dimensions of unencapsulated diodes are in the order of 0.2 mm; "beam lead" gallium arsenide (GaAs) or silicon (Si) Schottky barrier diodes can be used for this purpose. The unencapsulated semiconductors, shall then have to be mounted on a substrate, necessitating the application of microstrip, slot-line and/or coplanar waveguide techniques. The location of adapters at distances of one or several wavelengths from encapsulated semiconductors, as required in conventional waveguide techniques, whereby the bandwidth of the mixer is however strongly affected, can now be prevented; so it is possible to mount adapters in MIC's within the distance of a wavelength from the semiconductor on the substrate. It should be noted that unencapsulated semiconductors also include those whose encapsulation forms one entity with the active layers of the semiconductor proper and whose dimensions are less than about 2 mm.

Figure 2:
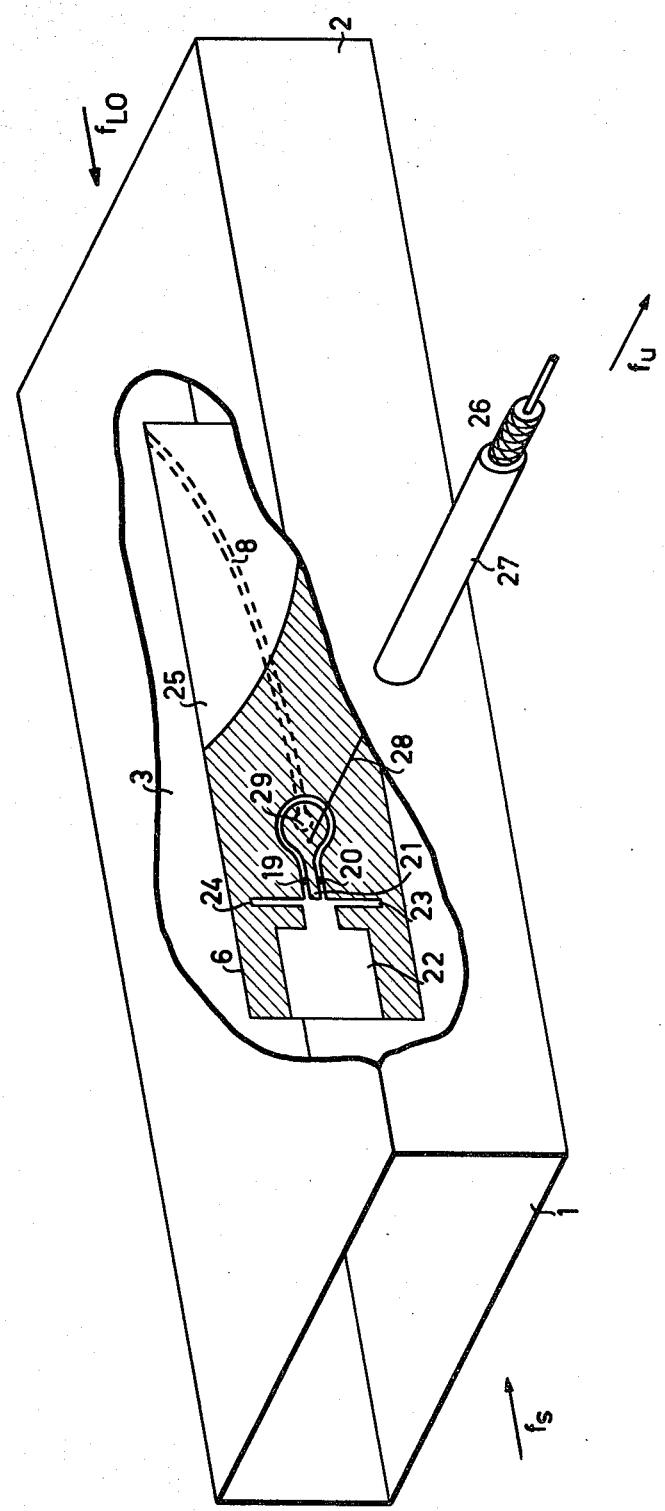
Figure 3A:
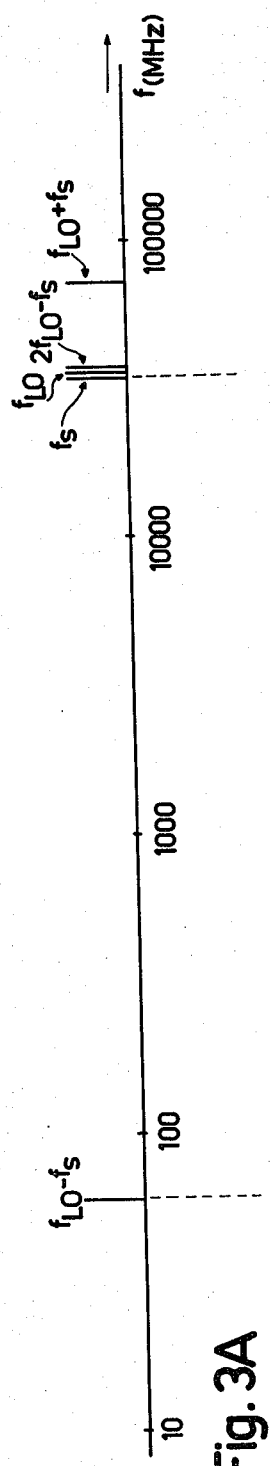
Figure 3B:
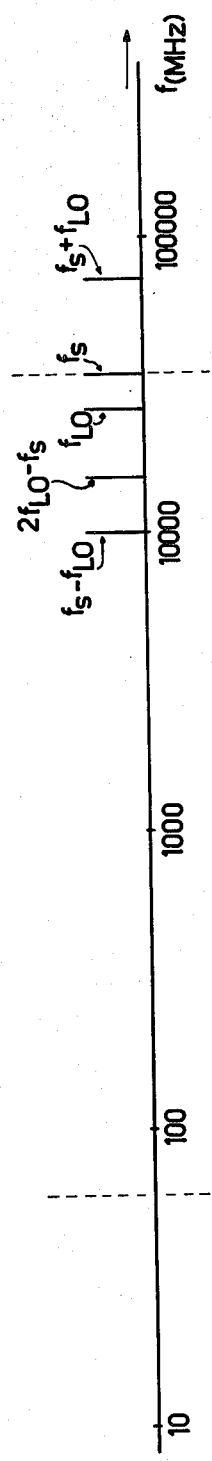
Figure 3C:
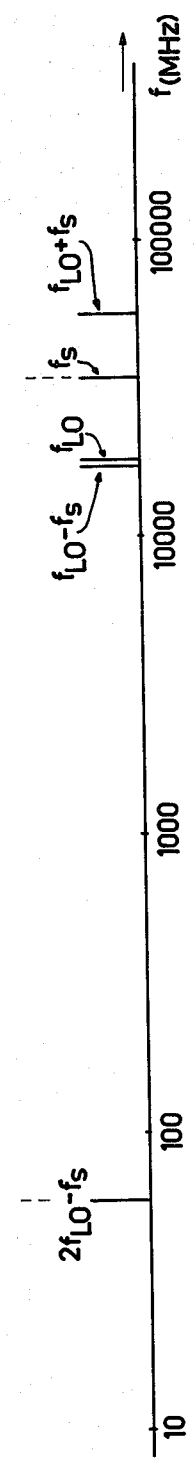

The invention will now be explained with reference to the accompanying figures, in which:

FIGS. 1 and 2 illustrate embodiments of the mixer according to the invention; while FIGS. 3A-3C show three frequency diagrams to illustrate the invention.

Corresponding parts in FIGS. 1 and 2 are designated by the same reference numerals.

The mixer illustrated in FIG. 1 comprises a first waveguide part 1 for the transmission of an input signal, to be converted to a lower frequency band, and a second waveguide part 2 for the transmission of a signal supplied by a local oscillator not shown in the figure. The two waveguide parts open into a cavity 3 housing a semiconductor 4. This semiconductor is used to obtain an output signal whose frequencies $f_u$ form a linear combination of the frequencies $f_s$ of the input signal and the frequency $f_{LO}$ of the local oscillator. The mixer further comprises a transmission line for the output signal. In view of the frequencies of this output signal, it is most desirable to use a waveguide for this transmission line in the embodiment in question. This is however not essential to the invention as will appear in the embodiment of FIG. 2 to be discussed hereafter. The cavity 3 in the embodiment of FIG. 1 is of the same dimensions as the waveguide part 5 connected to this cavity; this need not be so in other embodiments of the mixer.

In principle, the major frequency components of the signal generated in semiconductor 4 are $f_s$, $f_{LO}$, $f_s + f_{LO}$, $|f_{LO} - f_s|$ and $|2f_{LO} - f_s|$, that is if the local oscillator signal is substantially stronger than the input signal. If $f_s$ and $f_{LO}$ are chosen relatively close together, as was common practice up till now and is illustrated in FIG. 3A, the output signal will be produced by the difference frequencies $|f_{LO} - f_s|$. By employing modern semiconductors, it is possible to fabricate r.f. amplifiers to be connected to the mixer; on the supply of relatively high difference frequencies from the mixer, these r.f. amplifiers still provide a noise figure which is acceptable in practice. This permits the frequenices $f_s$ and $f_{LO}$ to be set further apart, see FIG. 3B, and has the special advantage that undesirable frequencies, in particular the image frequencies $|2f_{LO} - f_s|$, can be sufficiently suppressed. If nevertheless relatively low frequencies are desired for an r.f. amplifier, $f_s$ and $f_{LO}$ may be selected so far apart that the output signal is produced by the image frequency component $|2f_{LO} - f_s|$, permitting suppression of the undesired frequencies, especially the difference frequencies $|f_{LO} - f_s|$. The latter situation is illustrated in FIG. 3C. The way in which the undesired frequencies are suppressed will be discussed hereafter.

In general, for the frequencies $f_u$ of the output signal, $f_u = |f_s - f_{LO}|$ if $f_s \in (f_{LO} - f_g, f_{LO} + f_g)$ and $f_u = |2f_{LO} - f_s|$, if $f_s \in (2f_{LO} - f_g, 2f_{LO} + f_g)$, where $f_g$ is the maximum centre frequency, for which an r.f. amplifier connected to the mixer has a noise figure which is below a fixed maximum value.

The semiconductor 4 is mounted on a substrate 6 housed in cavity 3. To minimise conversion losses in the mixer, it is preferred to use a GaAs Schottky barrier diode as semiconductor, although Si Schottky barrier diodes may also be used. The unencapsulated semiconductor is mounted on substrate 6. This substrate is provided with microwave integrated circuits (MIC's) to form a connection between the semiconductor and the different waveguide parts. In the embodiment of FIG. 1 the connections from semiconductor 4 to waveguide parts 1 and 5 are realised by a slot-line 7, mounted on one side (in the figure the front side) of the substrate. The connection between semiconductor 4 and waveguide part 2 is formed by an electrically terminated microstrip 8 mounted on the other side (in the figure the rear side) of the substrate and arranged so that microstrip 8 crosses the slot-line 7 at right angles or substantially at right angles. Microstrip 8 and the conducting layer accommodating slot-line 7, consists of gold. Although microstrips, slot-lines and/or coplanar lines can generally be used for the connections between the semiconductor and the different waveguide parts, the embodiment of FIG. 1 incorporates a slot-line to connect semiconductor 4 to waveguide parts 1 and 5; this slot-line provides for a very good adaptation of the electric field in the different waveguide parts (TE-mode) to the electric field around the slot-line over the entire bandwidth of the input signal to be converted and over that of the output signal, as the electric field around the slot-line does not require mode conversion for such an adaptation. It is now however undesirable to use a slot-line for the connection between the semiconductor and waveguide part 2, as this would disturb the laboriously acquired adaptation of the input signals and that of the output signals to the semiconductor. For this reason, a microstrip mounted on the rear (in the figure) of the substrate is used between the semiconductor and waveguide part 2. In spite of the required mode conversion, i.e. a conversion from the TE-mode in waveguide part 2 to the TEM-mode in microstrip 8, it is still possible to adapt microstrip 8 to waveguide part 2 for a single frequency, viz. the local oscillator frequency. It is, however, always possible to compensate for losses by increasing the strength of the local oscillator signal. To prevent any crosstalk between slot-line and microstrip, and hence a mode disturbance, the substrate used in the embodiment in question is relatively thick, about 600μ and the width of the slot-line relatively small, 200μ, while the microstrip should cross the slot-line at a point where the electric field is at a minimum. In the embodiment in question the semiconductor is located at this point, unlike the embodiment of FIG. 2.

The adaptation problems, as discussed hereinbefore, imply how the impedance of the semiconductor can be adapted to the characteristic impedance of the respective waveguide parts for the desired frequencies. In principle, stepped transformers, tapered transmission lines and open and closed transmission lines in series or parallel with the connections between the semiconductor and the waveguide parts can be used for such adaptations. Since the conversion losses in the mixer are strongly determined by the sum frequencies $f_s + f_{LO}$ and the image frequencies $|2f_{LO} - f_s|$, these frequencies should also be suppressed by means of the above-mentioned adaptation devices. In the mixer of FIG. 1 the impedance of the semiconductor is adapted to waveguide part 1 for the frequency $f_s$ by means of the $\frac{1}{4}\lambda$ transformers 9 and 10, while in particular the imaginary part of the semiconductor impedance for this frequency is adapted through the terminated transmission line 11. The adaptation of the semiconductor impedance to waveguide part 5 for frequency $f_u = |f_{LO} - f_s|$ is realised by means of transmission line 12 and tapered line 13. The tapered transmission line 14 and the $\frac{1}{4}\lambda$ transmission line 15 provide for the adaptation to waveguide part 2. The terminated transmission line 16 and the transmission path between the connection of line 16 to slot-line 7 and the semiconductor are used to suppress the sum frequency $f_s + f_{LO}$, while the terminated line 17 and the transmission path between the connection of line 17 to line 12 and the semiconductor suppress the image frequency $|2f_{LO} - f_s|$. Besides, the less severe frequency component $|3f_{LO} - f_s|$ is suppressed by the application of the terminated line 18. The way in which the above adaptations can be realised needs no further explanation, as this is adequately described in the literature.

In the mixer of FIG. 2 two semiconductors 19 and 20 are mounted on the substrate 6. Each of these semiconductors can be of the same type as semiconductor 4 in the embodiment of FIG. 1. The substrate 6 is again placed in a cavity 3 to which the two waveguide parts 1 and 2 are connected. The input signal to be frequency-converted is supplied via waveguide part 1 and the local oscillator signal via waveguide part 2. The mixer of FIG. 2 functions as a balanced mixer. Each of the semiconductors 19 and 20 is incorporated, symmetrically with respect to each other, in one of the lines of a terminated coplanar line 21; this circuit may also be described to be the end of a slot-line designed as a closed loop. The microstrip 8 on the rear side (in the figure) of the substrate crosses the slot-line again at right angles or substantially at right angles and gives rise to an oppositely directed electric field around the slot-lines accommodating the semiconductors. The result is that, as with the functional balanced mixers, an electric field composed of in-phase fields from the input signals or from the local oscillator signals, is produced around one semiconductor and an electric field, consisting of phase-opposed fields from the latter signals, around the other semiconductor. The method of coupling the microstrip and the slot-line is known in the art and needs no further explanation apart from that given in the description of the embodiment in FIG. 1. Also in this embodiment the impedance adaptation is realised with conventional means, a stepped transformer 22, terminated slot-lines 23 and 24 and a tapered transmission line 25.

In the embodiment of FIG. 2, the frequency of the local oscillator signals has been so chosen that the frequency components of the output signals $f_u = |f_s - f_{LO}|$ or $f_u = |2f_{LO} - f_s|$ are of such a low value that these signals can be supplied to a connected i.f. amplifier via a coaxial cable 26. The outer conductor 27 of this cable is connected to the front (in the figure) of the substrate via the housing of the substrate with the conducting layer, while the inner conductor 28 of the coaxial cable is connected to the conducting layer enclosed by the looped slot-line. The parallel-connected semiconductors thus form a bypass of the coaxial cable 26. The inner conductor 28 could also be connected to an electrically terminated microstrip (not shown in the figure)

in series with the microstrip 8. The end 29 of the microstrip should then be in contact with the conducting layer enclosed by the looped slot-line via a metallic connection.

What we claim is:

1. A mixer comprising a first waveguide part for transmission of an input signal to be converted to a lower frequency band, a second waveguide part for transmission of a signal supplied by a local oscillator, said first and second waveguide parts opening into a cavity, a substrate positioned in said cavity and a first unencapsulated semiconductor for producing an output signal of frequency ($f_u$) which is a linear combination of the frequency ($f_s$) of the input signal and the local oscillator frequency ($f_{LO}$) mounted on said substrate, said mixer further including a transmission line for said output signal, and at least two microwave integrated circuits provided on said substrate and forming a connection between said first semiconductor and the two waveguide parts said microwave integrated circuit forming the connection between said first semiconductor and said first waveguide part including a slot-line mounted on one side of the substrate which contains therewithin said first semiconductor.

2. A mixer as claimed in claim 1, wherein the microwave integrated circuit forming the connection between said first semiconductor and the second waveguide part includes an electrically terminated microstrip mounted on the other side of the substrate, which microstrip crosses the slot-line at right angles or substantially at right angles.

3. A mixer as claimed in claim 2, in which the transmission line for the output signal comprises a coaxial cable, wherein the end of the slot-line forms a closed-loop, and further including a second, unencapsulated semiconductor, said first and second semiconductors being disposed symmetrically with respect to each other in the looped portion of the slot-line and being connected to the coaxial cable in such a way that they, in parallel connection, form a bypass of the coaxial cable.

4. A mixer as claimed in claim 1, or 2, wherein the transmission line for the output signal includes a third waveguide part opening into said cavity and a third microwave integrated circuit mounted on the substrate, said third circuit forming a connection between said first semiconductor and said third waveguide part.

5. A mixer as claimed in claim 4, wherein the microwave integrated circuits forming the connections between said first semiconductor and the first and third waveguide parts includes a single slot-line accommodating the semiconductor.

6. A mixer as claimed in claim 1 wherein $f_u = |f_s - f_{LO}|$, if $f_s \epsilon (f_{LO} - f_g, f_{LO} + f_g)$ and $f_u = |2f_{LO} - f_s|$, if $f_s \epsilon (2f_{LO} - f_g, 2F_{LO} + f_g)$, where $f_g$ is the maximum center frequency, for which an intermediate frequency amplifier, to be connected to the mixer, has a noise figure which is below a fixed maximum value.

* * * * *